United States Patent [19]

Werner et al.

[11] 4,297,599

[45] Oct. 27, 1981

[54] CIRCUIT ARRANGEMENT FOR OBTAINING AN INTERFERENCE-FREE TRIGGER SIGNAL ESPECIALLY FOR A FUEL APPORTIONMENT DEVICE IN AN INTERNAL COMBUSTION ENGINE

[75] Inventors: Peter Werner, Wiernsheim-Iptingen; Ulrich Drews, Vaihingen-Pulverdingen; Theodor Elbers, Krofdorf-Gleiberg; Klaus Jäckel, Reutlingen, all of Fed. Rep. of Germany

[73] Assignee: Robert Bosch GmbH, Stuttgart, Fed. Rep. of Germany

[21] Appl. No.: 66,743

[22] Filed: Aug. 15, 1979

[30] Foreign Application Priority Data

Oct. 31, 1978 [DE] Fed. Rep. of Germany ....... 2847290

[51] Int. Cl.³ .................... H03K 5/153; H03K 19/20
[52] U.S. Cl. .............................. 307/355; 123/475; 307/360; 307/440
[58] Field of Search ............ 307/355, 360; 328/147, 328/150, 117; 123/475

[56] References Cited

U.S. PATENT DOCUMENTS

| 3,585,507 | 6/1971 | Bickel | 307/360 |
| 3,633,028 | 9/1972 | Fussell | 328/117 |
| 4,015,144 | 3/1977 | Brouckaert | 307/360 |
| 4,056,738 | 11/1977 | Gustafson | 328/115 |

OTHER PUBLICATIONS

Dual Channel Amplifier System by L. J. Wallace, IBM Tech. Disclre. Bttn., vol. 17 No. 12, pp. 3564–3566, 5/75.

*Primary Examiner*—Larry N. Anagnos
*Assistant Examiner*—B. P. Davis
*Attorney, Agent, or Firm*—Edwin E. Greigg

[57] ABSTRACT

A circuit arrangement for obtaining an interference-free trigger signal such as for a fuel apportionment device from the ignition signal of an internal combustion engine, particularly one having a current-regulated final ignition stage. The output of the circuit arrangement begins when a signal derived from the final ignition stage exceeds a first, high threshold value and is terminated when, after falling below a second, low threshold value, a predetermined time lag period has ended. In this manner, a desired interference-free trigger signal is obtained which can be used to trigger various rpm-dependent circuit arrangements, such as electronic fuel apportionment and gear control.

8 Claims, 4 Drawing Figures

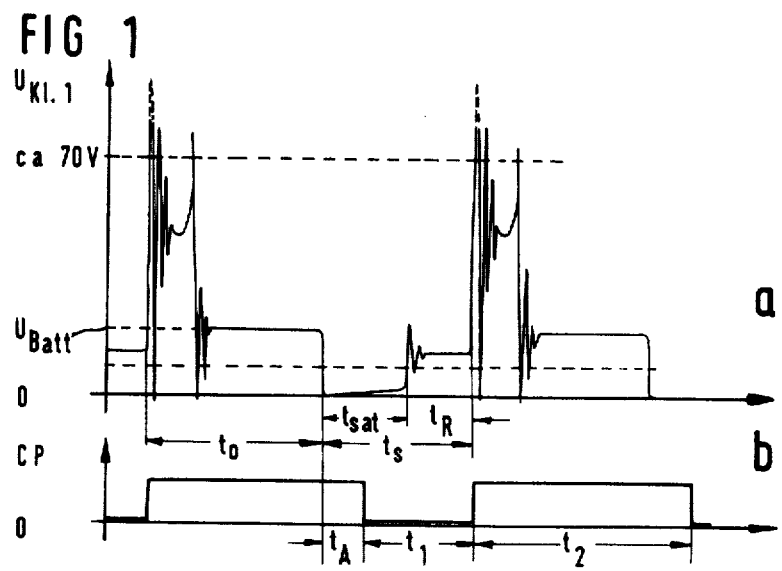
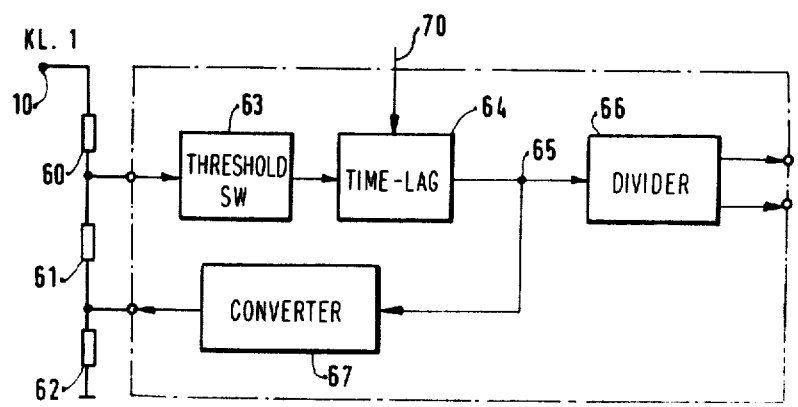

CIRCUIT ARRANGEMENT FOR OBTAINING AN INTERFERENCE-FREE TRIGGER SIGNAL ESPECIALLY FOR A FUEL APPORTIONMENT DEVICE IN AN INTERNAL COMBUSTION ENGINE

BACKGROUND OF THE INVENTION

A circuit arrangement is known for obtaining a trigger signal from the ignition signal of an internal combustion engine which includes a threshold switch and in which the output signal of the circuit arrangement is dependent on the presence of a value above or below the selected threshold value. Because of various interfering factors in connection with the ignition system in internal combustion engines, such a circuit arrangement has proved to be overly susceptible to interference.

OBJECT AND SUMMARY OF THE INVENTION

It is therefore the object of the invention to provide a circuit arrangement for obtaining interference-free trigger signals.

The circuit arrangements of the invention have the advantage over the prior art in that they function free of interference; that is, they do not react to spurious signals which normally occur, and at the same time are not vulnerable to transient oscillation and chatter.

The switching arrangements in accordance with the invention have proved quite free from interference, especially in the case where the signals are picked up from ignition systems having a current-regulated final stage. The circuit arrangements of the invention are particularly simplified when a re-triggerable monostable multivibrator is used for the intended time lag forward-control stages, and when an SR flip/flop is used as the timing circuit.

The invention will be better understood as well as further objects and advantages thereof become more apparent from the ensuing detailed description of preferred embodiments taken in conjunction with the drawings.

BRIEF DESCRIPTIONS OF THE DRAWINGS

FIGS. 1a and 1b illustrate two pulse diagrams pertaining to the input signal and the output signal of the switching arrangements of the invention;

FIG. 4 is a block diagram of a modification of the circuit arrangement of FIG. 2.

DESCRIPTION OF THE PREFERRED EMBODIMENTS

Figure 2:
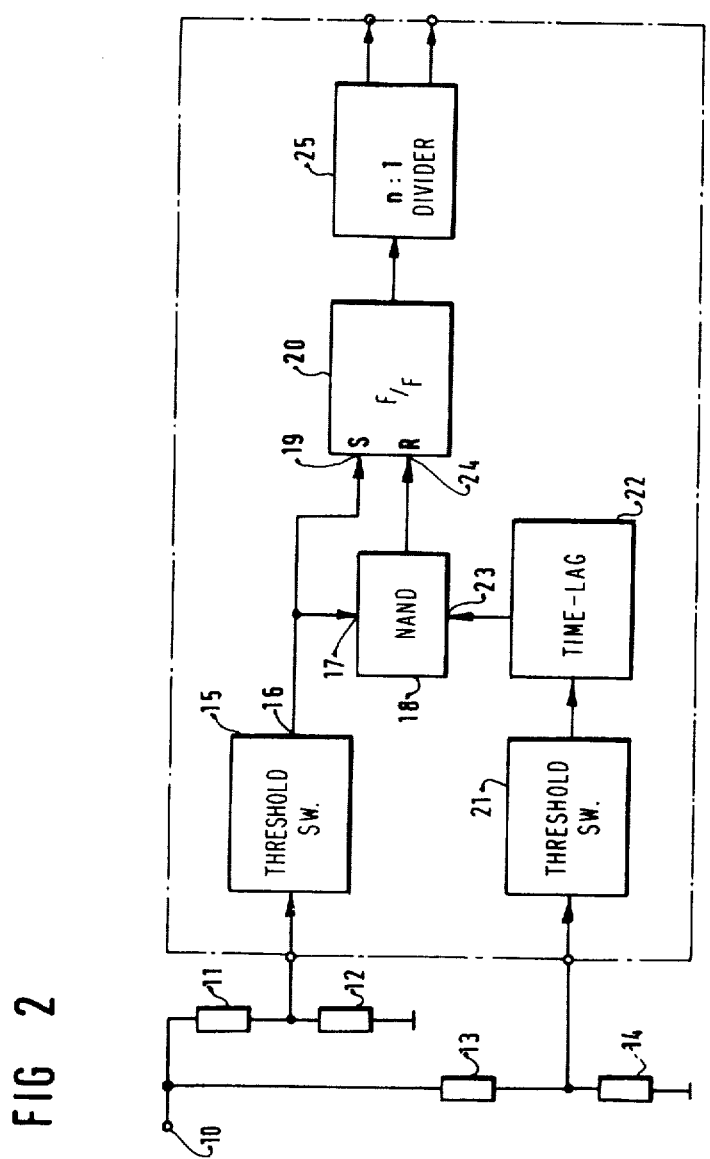
FIG. 2 is a block diagram of one embodiment of the circuit arrangement of the invention.

Referring now to the drawings, the subject matter of the invention pertains to a circuit arrangement for obtaining an interference-free trigger signal from the ignition signal of an internal combustion engine with current-regulated ignition. In FIGS. 1a and 1b, the output signal of a current-regulated final ignition stage is indicated, as well as the output signal of the circuit arrangement in accordance with the invention.

It can be seen in FIG. 1a that at the beginning of an opening period having the duration $t_0$, there is a very sharp voltage rise because of the self-induction effect of the ignition coil. Subsequent to this steep voltage increase, a transient oscillation phase occurs with sharply delineated fluctuation amplitudes, which changes into a state of rest, whereupon the signal value during this resting phase corresponds to the battery voltage $U_{Batt}$.

During the subsequent closing period $t_S$, a slow rise in electrical current takes place in the ignition coil, whereupon this rise in current changes at about the end of the closing period into a current-regulated phase. During this phase, the output voltage of the final ignition stage amounts to approximately two-thirds of the battery voltage. Upon a subsequent renewed current-interruption process, the same signal behavior is produced as described at the outset.

Two different phases can be distinguished within the closing period $t_S$. A first phase, during which the ignition coil moves into saturation, is designated as $t_{sat}$ and it is immediately followed by a regulated time $t_R$, during which the ignition coil current is regulated.

FIG. 1b shows the output signal of the circuit arrangement of the invention for obtaining an interference-free trigger signal, and it can be seen that this output signal begins at the beginning of the opening period and ends after a certain chatter-blocking period, immediately following the opening period. The output signal of the circuit arrangement thus corresponds in frequency exactly to the ignition frequency and can be further processed in any desired number of subsequent stages.

FIG. 2, in a block diagram of one embodiment of the circuit arrangement in accordance with the invention. The input of the circuit arrangement of FIG. 2 is a terminal 10, from which two voltage dividers having the resistors 11, 12, 13 and 14 respectively, are connected in parallel to ground. The connecting point of the two resistors 11 and 12 is connected to a first threshold switch 15, whose output 16 is conducted to both a first input 17 of a logic circuit 18 and to the set input 19(S) of a flip/flop 20. Similarly, the connecting point of the two resistors 13 and 14 is connected to a second threshold switch 21, which is followed by a time lag forward-control stage 22 whose output signal in turn is carried to the second input 23 of the logic circuit 18. On the output side, the logic circuit 18 is connected with the reset input 24(R) of the flip/flop 20. In accordance with the intended use of the circuit arrangement, that is, to obtain an interference-free trigger signal for a fuel apportionment device, the flip/flop 20 is followed by a frequency divider 25, in order to generate a signal for the injection control stage which has a frequency corresponding to the ignition frequency.

The two voltage dividers having the resistors 11–14 of FIG. 2 are set to accord with the two threshold values plotted in FIG. 1a. An upper threshold value, in the diagram FIG. 1a, lies at about 70 volts and a lower threshold value is about half the operational voltage. In the arrangement of FIG. 2, the first voltage divider with the two resistors 11 and 12 is intended to be set to the upper threshold value, and the second voltage divider with the resistors 13 and 14 is intended to be set to the lower threshold value.

The logic circuit 18 is embodied as a NAND gate; that is, the logic circuit 18 produces an output signal at its output whenever there is no positive input signal present at either of its inputs 17 and 23.

The time lag forward-control stage 22 is embodied as a re-triggerable monostable multivibrator which responds to pulse edges. Re-triggerable means that the time lag $t_4$ begins a new for this re-triggerable monostable multivibrator at each trigger signal.

The circuit arrangement of FIG. 2 may be better understood with reference to the pulse diagram of FIG. 1a. At the beginning of the opening period, a very high voltage peak is established as shown in FIG. 1a. The first threshold switch 15 responds and produces at its output 16 a positive signal, which results in the setting of flip/flop 20. This high threshold value is admittedly immediately again higher than the actual value in accordance with the fluctuating behavior of the ignition signal. However, this actual value, with brief exceptions, remains above the second threshold, so that the second threshold switch 21 subsequently also produces a positive signal and thus keeps the time lag forward-control stage 22 constantly set. During the brief time when the actual value falls below the second threshold value, the output signal of the second threshold switch 21 does return briefly to zero. However, this interruption is bridged over the time lag foward-control stage 22. By reason of the logic selected in the logic circuit 18, the flip/flop 20 is thus not reset.

A change in the signal behavior of the arrangement of FIG. 2 first appears after the end of the opening period; that is, when the closing time begins, because then the signal at the input 10 drops (as seen in the diagram of FIG. 1a) to a very low value and falls below the lower threshold value. From this moment on, including possible occurrences of chatter, the time duration of the time lag forward-control stage 22 runds out, and at its end, a positive signal is produced at the output of the logic circuit 18, as a result of which the flip/flop 20 is reset. The flip/flop 20 is thus reset only when the actual value has fallen below both the upper threshold and the lower threshold values and, in fact, below the lower threshold value for a predeterminable time.

Thus, the signal according to FIG. 1b appears at the output of the flip/flop 20. In the subsequent frequency divider 25, the output signal of the flip/flop 20 is subdivided in frequency in accordance with the number of cylinders in the internal combustion engine being used.

Figure 3:
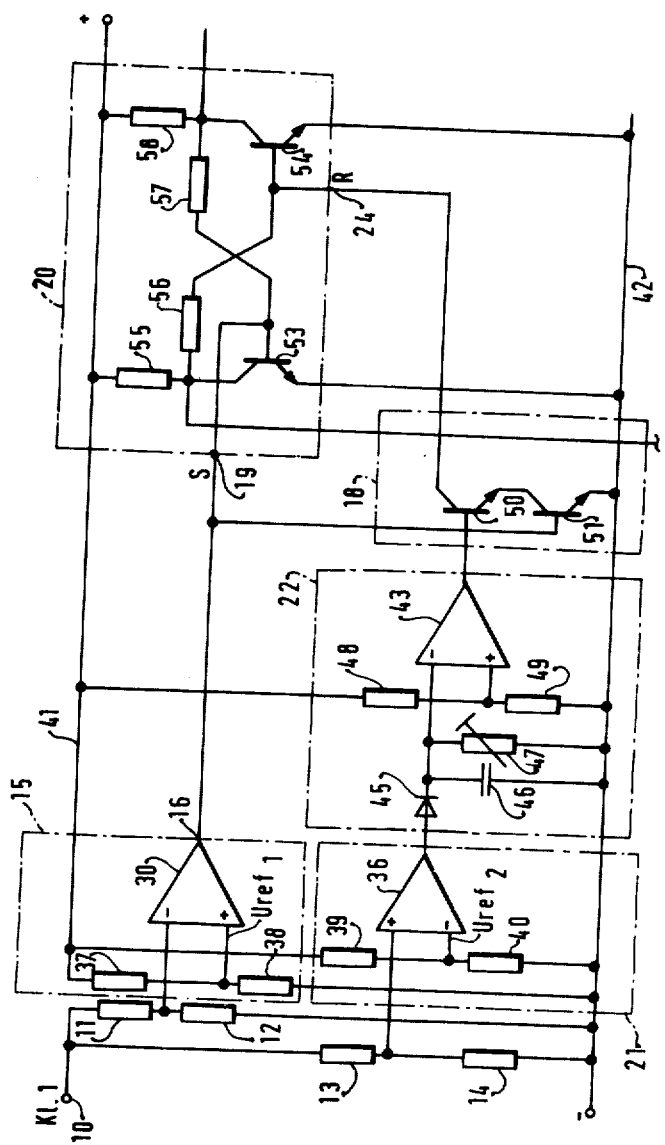
FIG. 3 is a schematic wiring diagram of the embodiment of FIG. 3.

FIG. 3 shows one arrangement for providing subject matter of FIG. 2. The threshold switches 15 and 21 each comprise a differential amplifier 30 and 36, respectively, with the connection point of the two resistors 11 and 12 coupled to the inventing input of the differential amplifier 30 and the connection point of the two resistors 13 and 14 connected to the non-inverting input of the differential amplifier 36. The two other inputs of the differential amplifiers 30 and 36 are connected with two voltage dividers made up of the resistors 37, 38 and 39, 40 respectively, which lie between a positive voltage line 41 and a ground line 42.

The time lag forward-control stage 22 is provided by a threshold switch 43 in combination with a diode-capacitor-resistor combination. The output of the threshold switch 21 is fed to a diode 45, whose cathode is connected to the inventing input of the operational amplifier 43 and this input in turn is connected to ground via a parallel circuit of a capacitor 46 and a variable resistor 47. The non-invention input of the operational amplifier 43 is connected to a voltage divider comprising two resistors 48 and 49 between the positive line 41 and the ground line 42.

The logic circuit 18 comprises a series circuit of two NPN transistors 50 and 51 with the base of one transistor 50 connected to the output of the operational amplifier 43 of the time lag forward-control stage 22 and the base of the second transistor 51 connected to the output 16 of the first threshold switch 15. While the emitter of the transistor 51 is connected to the ground line 42, the collector of the transistor 50 leads to the reset input 24(R) of the flip/flop 20. Its set input 19(S) is connected to the output 16 of the first threshold switch 15.

The primary component of the flip/flop 20 is two transistors 53 and 54, the base of the transistor 53 connected directly to the set input 19(S) and the emieter is connected directly to the ground line 42. On the collector side, this transistor 53 is connected first, via a resistor 55, to the positive line 41 and, second, via a resistor 56, to the base of the transistor 54. There is a corresponding coupling between the collector of the transistor 54, via a resistor 58 to the positive line 41. The emitter of the transistor 54, as well, is coupled to the ground line 42 and the output of the flip/flop 20 is formed by a connection to the collector of the transistor 54.

There are no differences in circuit function between the two arrangements of FIGS. 2 and 3. The two threshold switches 15 and 21 react when an actual value is above or below the two threshold values of FIG. 1a. However, it must be noted that a voltage which increases in a negative direction is applied at the input 10.

In the arrangement of FIG. 3, a so-called "Sparmono", as it is known in the literature, serves as the time lag forward-control stage 22. The flip/flop 22 has no further unusual technical characteristics.

FIG. 4 shows a further example of a circuit arrangement for obtaining an interference-free trigger signal, where, in contrast to the circuit arrangements of FIGS. 2 and 3, it is not two separate threshold switches which are used, but rather one threshold switch with a convertible switching threshold value.

In the circuit arrangement of FIG. 4, between the input terminal 10 and ground, there is a series circuit of three resistors 60, 61 and 62. Connected to the connecting point between the two resistors 60 and 61, is a series circuit comprising threshold 63 and time lag forward-control stage 64, which may be formed in the same manner as in the example of FIG. 3. The output of the time lag forward-control stage 64 is connected to a branching point 65, which is followed first by a frequency divider 66 and then by a threshold converter stage 67. On the output side, the threshold converter stage 67 is connected to the connection point of the two resistors 61 and 62. It is the object of the threshold converter stage 67 to short-circuit the resistor 62 at certain times. In the event of a short circuit, the threshold switch 63 responds to a high input voltage and when the resistor 62 is not short-circuited, it responds to a low voltage corresponding to the second threshold value of FIG. 1.

When the apparatus is in the resting state, the resistor 62 is thus short-circuited, and the threshold switch 63 responds to the very high first threshold value. The time lag forward-control stage 64 emits a corresponding positive output signal, as a result of which the threshold converter stage 67 is supplied with a conversion pulse and the short circuiting of resistor 62 is terminated. In the subsequent period, the threshold switch 63 thus reacts to the lower threshold value of FIG. 1a, while the actual value has first fallen below this threshold value only at the instant when closing begins. Subsequent to this period is the time lag period, also called the chatter-blocking period $t_4$, so that the signal according to FIG. 1b is present at the branch point 65.

In constructing the time lag forward-control stage 22 of FIG. 2 or stage 64 of FIG. 4, attention must be paid to keeping the chatter-blocking time $t_4$ smaller than the duration of the saturation of the final ignition stage, so that positive dropping off of the output signal of the described circuit arrangement is accomplished.

Finally, the chatter-blocking period $t_4$, which is formed in the time lag forward-control stage 22 or 64, is selected in accordance with operational characteristics or operational states such as the state of starting. Thus, it is effective to choose a longer chatter-blocking period $t_4$ during starting, for instance (that is at low rpm), than that chosen for operational states occurring after starting.

The foregoing relates to preferred embodiments of the invention, it being understood that other embodiments and variants thereof are possible within the spirit and scope of the invention, the latter being defined by the appended claims.

What is claimed and desired to be secured by letters patent of the United States is:

1. In an interference-free triggering circuit, for regulating ignition current signals to an electronic fuel apportionment device for an internal combustion engine, the triggering circuit including:
   a first threshold switch to which a first current signal is applied to generate an output if a first threshold value is exceeded by the first current signal;
   a second threshold switch to which a second current signal is applied to generate an output if a second threshold value is exceeded by the second current signal;
   a time-lag circuit connected to the second threshold switch to receive and delay the second threshold output;
   a logic circuit, connected to the first threshold switch and the time-lag circuit to receive the output of the first threshold switch and the output of the time-lag circuit such that the logic circuit generates a reset signal only when the logic circuit receives no output from the first threshold switch and no output from the time-lag circuit; and
   a switching element, connected to the first threshold switch and the logic circuit such that the switching element is set by the first threshold switch output and is reset by the logic circuit reset signal to generate a command signal to the fuel apportionment device.

2. A triggering circuit in accordance with claim 1 having an operational voltage, wherein said first threshold switch is adapted to be set to a relatively high value (approximately 70 volts) and said second threshold switch is adapted to be set to a value below the operational voltage.

3. A triggering circuit in accordance with claim 1, wherein said time lag circuit comprises a re-triggerable monostable multivibrator.

4. A triggering circuit in accordance with claim 3, wherein the output signal of the time lag circuit is controllable in accordance with operational characteristics at the instant of starting.

5. A triggering circuit in accordance with claim 3, wherein the output signal of the time-lag circuit is controllable in accordance with operational stages at the instance of starting.

6. A triggering circuit in accordance with claim 1, wherein said switching element comprises an SR flip-flop.

7. A method of obtaining an interference-free trigger signal for a fuel apportionment device of an internal combustion engine comprising the steps of:
   applying an ignition signal to a first threshold switch to provide a first output signal;
   applying said ignition signal to a second threshold switch having a different threshold value from said first threshold switch to provide a second output signal;
   conducting said second output signal from said second threshold switch to a time lag forward-control stage to provide a third output signal;
   feeding said first output signal and said third output signal to a logic circuit to provide a fourth output signal only when the first output signal and third output signal are zero, and
   applying said first output signal to a set input of a switching element and said fourth output signal to a reset input of said switching element which can be turned on and off, the output of which provides said trigger signal for said fuel apportionment device.

8. In an interference-free triggering circuit having an operational voltage source, for regulating ignition current signals to an electronic fuel apportionment device for an internal combustion engine, the triggering circuit including:
   a threshold switch to which a current signal is applied to generate an output if a threshold value is exceeded by the current signal;
   a two stage voltage divider including a pair of resistors having a common connection point, and including a single resistor connected to the operational voltage source;
   a time-lag circuit connected to the common connection point via the threshold switch to receive and delay the threshold switch output;
   wherein the threshold switch is directly connected to the common connection point, and wherein the single resistor is connected to the output of the time lag circuit such that the single resistor is short circuited according to the time-lag circuit output.

* * * * *